(12) United States Patent
Huang

(10) Patent No.: US 10,629,870 B1
(45) Date of Patent: Apr. 21, 2020

(54) CIRCUIT BOARD AND BATTERY HOLDER THEREOF

(71) Applicants: INVENTEC (PUDONG) TECHNOLOGY CORPORATION, Shanghai (CN); INVENTEC CORPORATION, Taipei (TW)

(72) Inventor: Chen-Wei Huang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/573,771

(22) Filed: Sep. 17, 2019

(30) Foreign Application Priority Data

Jun. 6, 2019 (CN) .......................... 2019 1 0492975

(51) Int. Cl.
*H05K 7/00* (2006.01)
*H01M 2/10* (2006.01)
*H01R 33/18* (2006.01)
*H01R 33/94* (2006.01)
*H05K 1/18* (2006.01)

(52) U.S. Cl.
CPC .......... *H01M 2/1044* (2013.01); *H01R 33/18* (2013.01); *H01R 33/94* (2013.01); *H05K 1/184* (2013.01); *H01M 2220/30* (2013.01); *H05K 2201/10037* (2013.01); *H05K 2201/10378* (2013.01); *H05K 2201/10515* (2013.01)

(58) Field of Classification Search
USPC ......................................................... 36/760
See application file for complete search history.

(56) References Cited

U.S. PATENT DOCUMENTS

| 2007/0223317 A1* | 9/2007 | Sun | ..................... H01M 2/1044 368/88 |
| 2009/0000937 A1* | 1/2009 | Moore | ................ H01M 2/1044 200/534 |

* cited by examiner

*Primary Examiner* — Andargie M Aychillhum
(74) *Attorney, Agent, or Firm* — Maschoff Brennan

(57) ABSTRACT

A circuit board including electronic component and battery holder. Battery holder is fixed to circuit board and includes base, first conductive component and second conductive component. Base includes bottom portion and side portion. Bottom portion has top surface and bottom surface. Side portion stands on top surface. Side portion and bottom portion form accommodation space. First conductive component includes first contact part, first support part and first protruding part. First support part is connected to first contact part. First protruding part is located on first support part. First contact part is located in accommodation space. First support part extends outwards along normal direction of bottom surface. First protruding part extends along longitudinal direction of first support part, and side of first support part that is located away from first contact part is fixed to circuit board. Electronic component is located between bottom surface and circuit board.

10 Claims, 7 Drawing Sheets

CIRCUIT BOARD AND BATTERY HOLDER THEREOF

CROSS-REFERENCE TO RELATED APPLICATIONS

This non-provisional application claims priority under 35 U.S.C. § 119(a) on Patent Application No(s). 201910492975.3 filed in China, on Jun. 6, 2019, the entire contents of which are hereby incorporated by reference.

BACKGROUND OF THE INVENTION

Technical Field of the Invention

The disclosure relates to a circuit board, more particularly to a circuit board including a battery holder.

Description of the Related Art

In general, a battery holder is directly fixed to a circuit board by being stacked on the circuit board.

The battery holder covers and occupies a part of the circuit board, such that the rest area of the circuit board available for other electronic components is decreased. Thus, a desired way should be found to stably fix the battery holder to the circuit board without decreasing the available area on the circuit board for other electronic component to be disposed.

SUMMARY OF THE INVENTION

An embodiment of the disclosure provides a circuit board including an electronic component and a battery holder. The electronic component is disposed on the circuit board. The battery holder is fixed to the circuit board and includes a base, a first electrically conductive component and a second electrically conductive component. The base includes a bottom portion and a side portion. The bottom portion has a top surface and a bottom surface facing away from each other. The side portion stands on the top surface of the bottom portion. The side portion and the bottom portion form an accommodation space therebetween, and the top surface of the bottom portion is located in the accommodation space. The first electrically conductive component is fixed to the base and includes a first electrical contact part, a first support part and a first protruding part. The first support part is connected to the first electrical contact part. The first protruding part is located on the first support part. The first electrical contact part is located in the accommodation space. The first support part is disposed through the top surface of the bottom portion and the bottom surface of the bottom portion and extends outwards along a normal direction of the bottom surface of the bottom portion. The first protruding part extends along a longitudinal direction of the first support part, and a side of the first support part that is located away from the first electrical contact part is fixed to the circuit board. The second electrically conductive component is fixed to the base and includes a second electrical contact part, a second support part and a second protruding part. The second support part is connected to the second electrical contact part. The second protruding part is located on the second support part. The second electrical contact part is located in the accommodation space. The second support part is disposed through the top surface of the bottom portion and the bottom surface of the bottom portion and extends outwards along the normal direction of the bottom surface of the bottom portion. The second protruding part extends along a longitudinal direction of the second support part, and a side of the second support part that is located away from the second electrical contact part is fixed to the circuit board. The electronic component is located between the bottom surface of the bottom portion of the battery holder and the circuit board.

Another embodiment of this disclosure provides a battery holder configured to be fixed to a circuit board and including a base, a first electrically conductive component and a second electrically conductive component. The base includes a bottom portion and a side portion. The bottom portion has a top surface and a bottom surface facing away from each other. The side portion stands on the top surface of the bottom portion so that the side portion and the bottom portion form an accommodation space therebetween, and the top surface of the bottom portion is located in the accommodation space. The first electrically conductive component is fixed to the base and includes a first electrical contact part, a first support part and a first protruding part. The first support part is connected to the first electrical contact part. The first protruding part is located on the first support part. The first electrical contact part is located in the accommodation space. The first support part is disposed through the top surface of the bottom portion and the bottom surface of the bottom portion and extends outwards along a normal direction of the bottom surface of the bottom portion. The first protruding part extends along a longitudinal direction of the first support part, and a side of the first support part that is located away from the first electrical contact part is fixed to the circuit board. The second electrically conductive component is fixed to the base and includes a second electrical contact part, a second support part and a second protruding part. The second support part is connected to the second electrical contact part. The second protruding part is located on the second support part. The second electrical contact part is located in the accommodation space. The second support part is disposed through the top surface of the bottom portion and the bottom surface of the bottom portion and extends outwards along the normal direction of the bottom surface of the bottom portion. The second protruding part extends along a longitudinal direction of the second support part, and a side of the second support part that is located away from the second electrical contact part is fixed to the circuit board.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
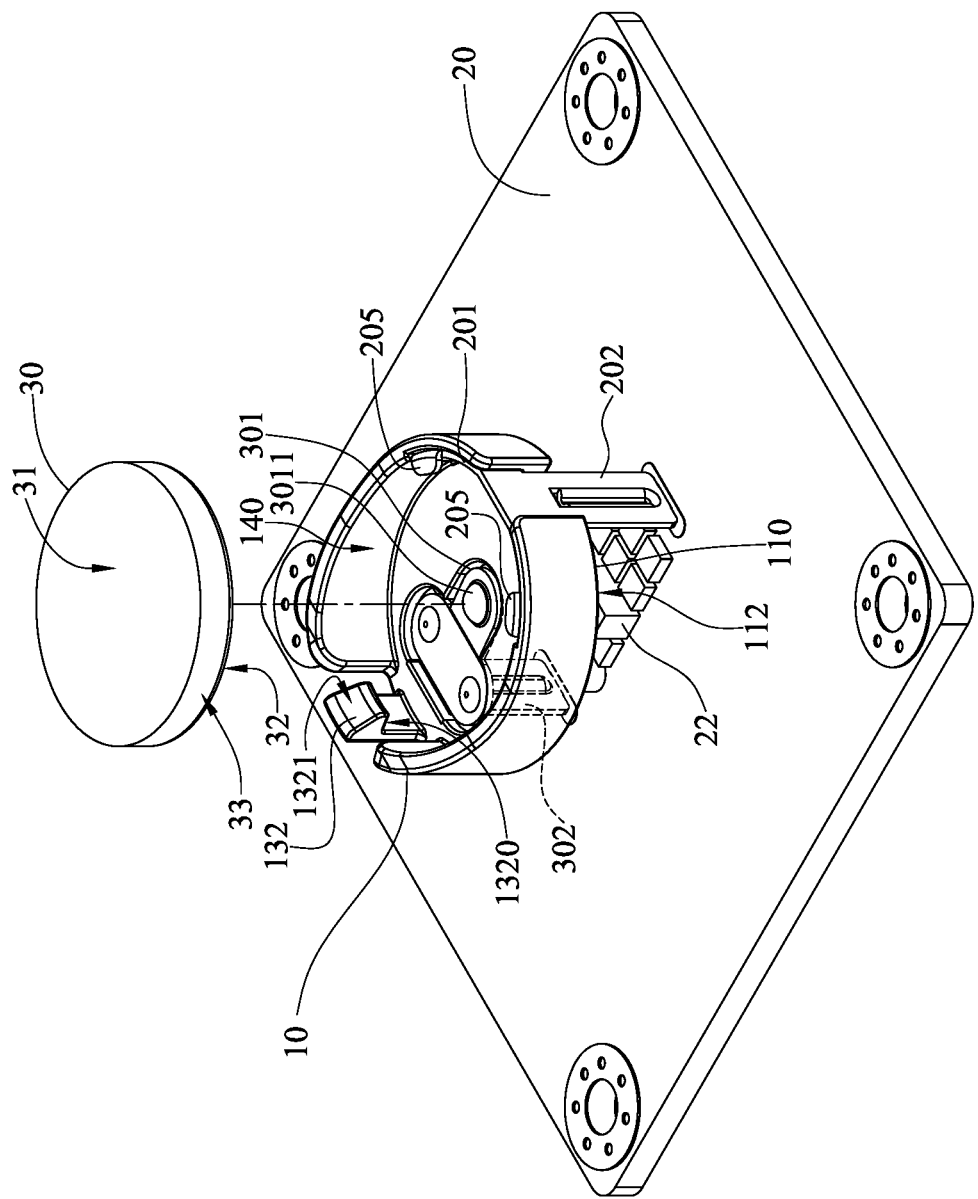
FIG. 1 is a perspective view of a circuit board according to an embodiment of the disclosure and a battery.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
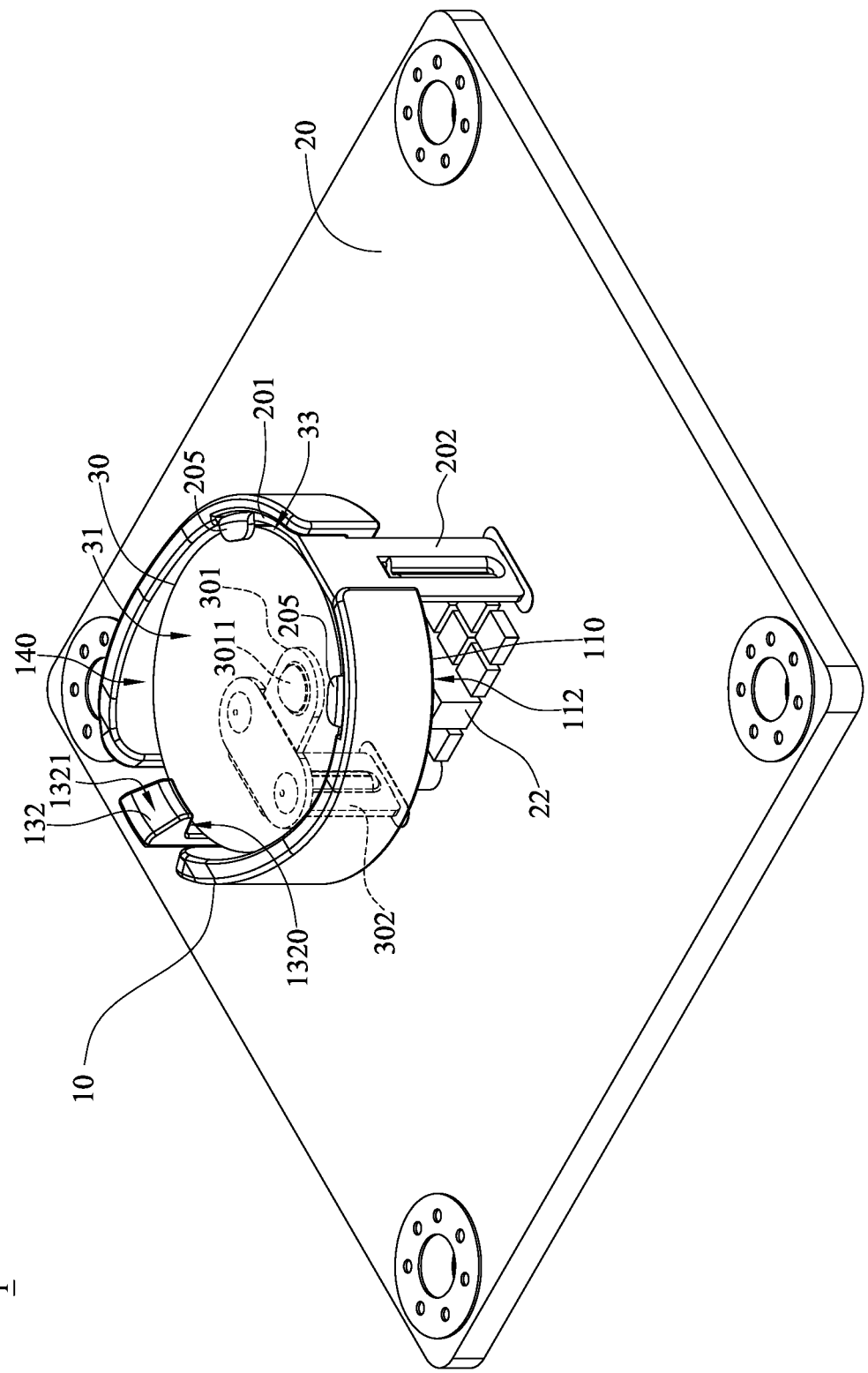
FIG. 2 is a perspective of the circuit board and the battery in FIG. 1 when the battery is installed in the battery holder.

Please refer to FIG. 1 and FIG. 2. FIG. 1 is a perspective view of a circuit board according to an embodiment of the disclosure and a battery. FIG. 2 is a perspective of the circuit board and the battery in FIG. 1 when the battery is installed in the battery holder.

This embodiment provides a circuit board 1 including a battery holder 10, a plate 20 and an electronic component 22. The battery holder 10 is configured to fix a battery 30 in position. The battery 30 has a top surface 31, a bottom surface 32 and a side surface 33. The top surface 31 and the bottom surface 32 are located opposite to each other, and the side surface 33 is connected to the top surface 31 and the bottom surface 32. The electronic component 22 is disposed on the plate 20. The battery holder 10 is fixed on the plate 20.

Figure 3:
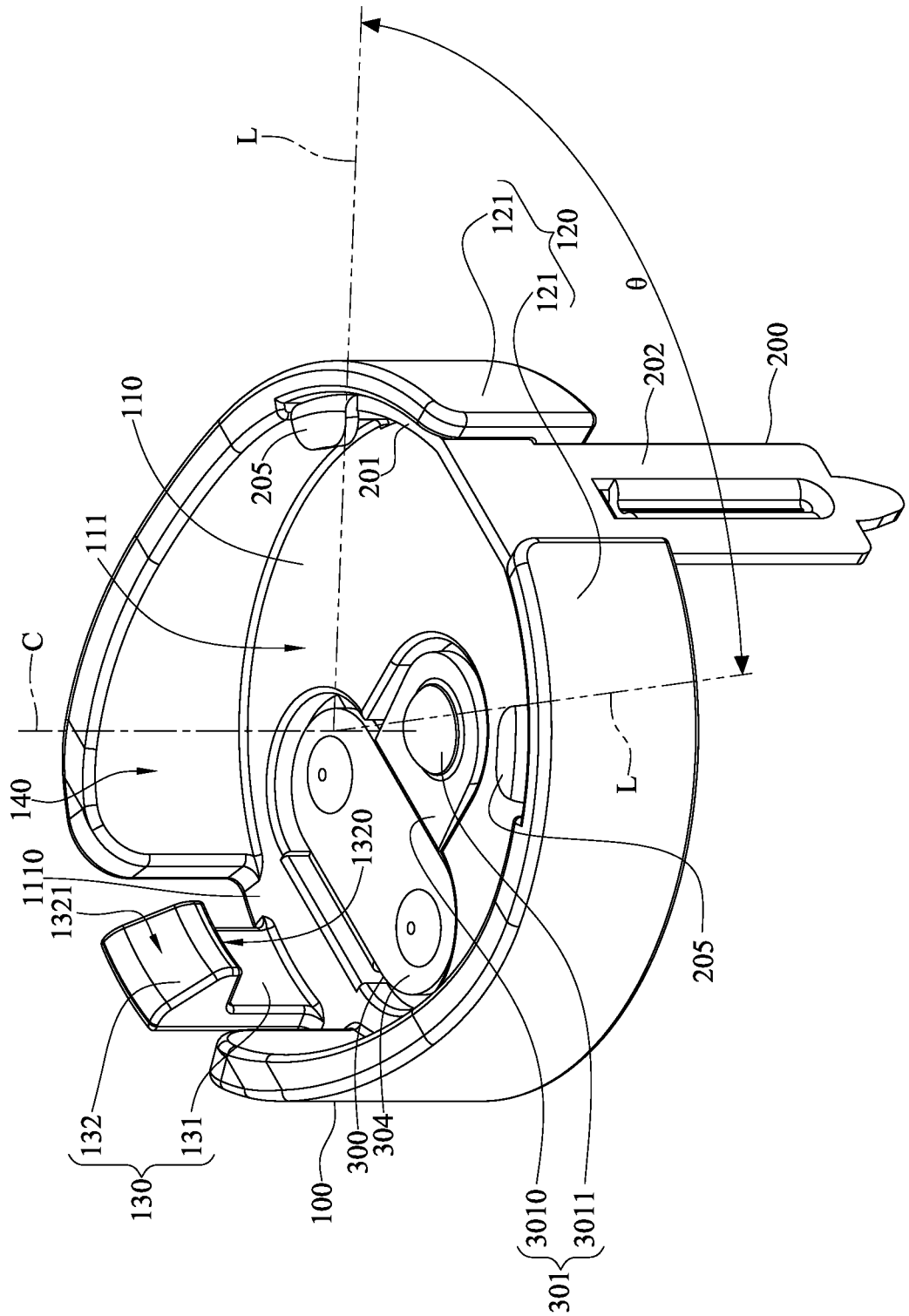
FIG. 3 is a perspective view of the circuit board in FIG. 1.
Figure 4:
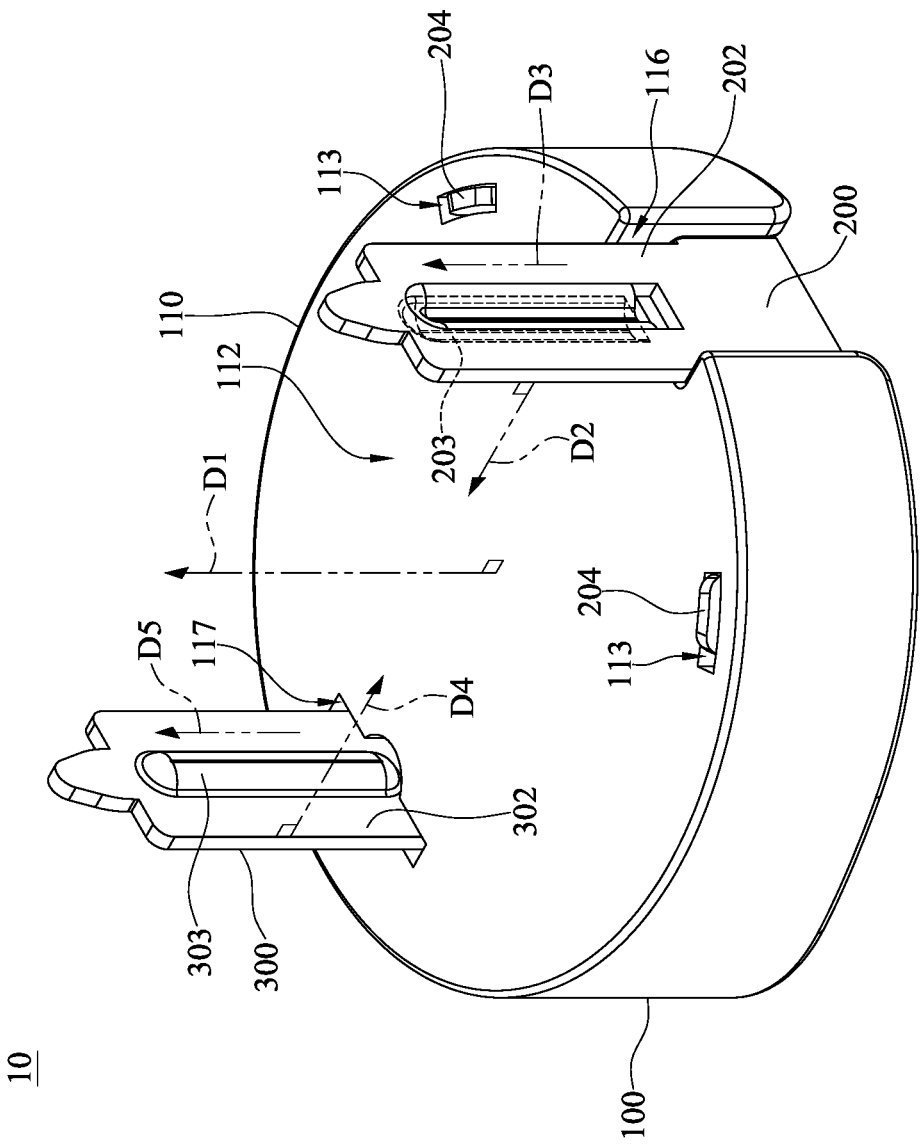
FIG. 4 is another perspective view of the battery holder in FIG. 1.
Figure 5:
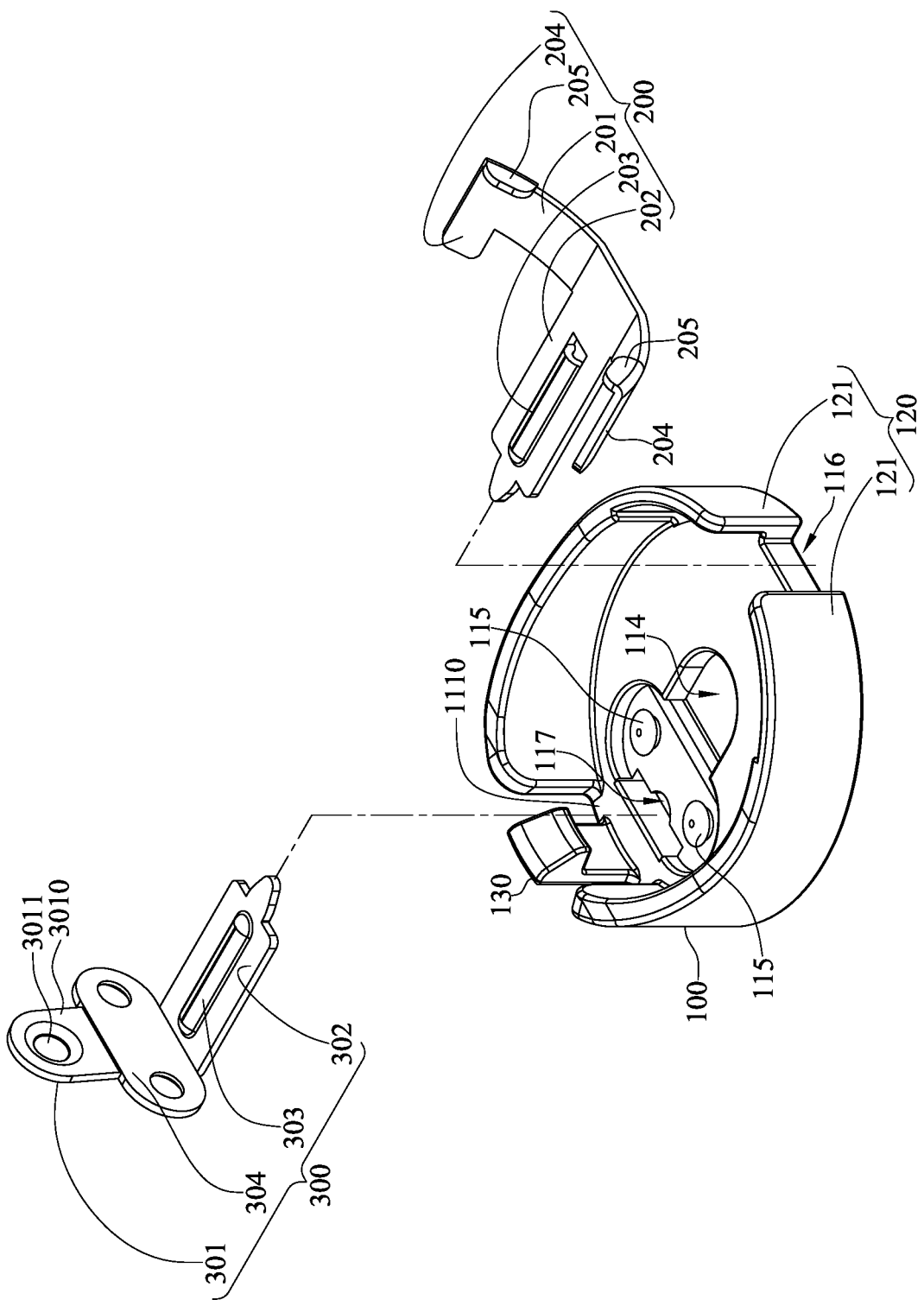
FIG. 5 is an exploded view of the battery holder in FIG. 3.

Please refer to FIG. 2 to FIG. 5. FIG. 3 is a perspective view of the circuit board 1 in FIG. 1. FIG. 4 is another perspective view of the battery holder 10 in FIG. 3. FIG. 5 is an exploded view of the battery holder 10 in FIG. 1.

The battery holder 10 includes a base 100, a first electrically conductive component 200 and a second electrically conductive component 300.

The base 100 may include a bottom portion 110, a side portion 120 and an engagement portion 130. The bottom portion 110 has a top surface 111 and a bottom surface 112 facing away from each other. The bottom portion 110 has two insertion holes 113, an installation recess 114 and a through hole 117. The two insertion holes 113 and the through hole 117 penetrate through the bottom portion 110 so as to connect to the top surface 111 and the bottom surface 112. The installation recess 114 is formed on the top surface 111, and there are two fixing structures 115 locating in the installation recess 114 and protruding from the top surface 111. The side portion 120 may include two side walls 121. The side walls 121, for example, stand on a peripheral region 1110 of the top surface 111 and are spaced apart from each other. The side walls 121 and the bottom portion 110 form an accommodation space 140 therebetween. The top surface 111 is located in the accommodation space 140. In addition, there is a recess 116 formed on an edge (not labeled) of the bottom portion 110 and located in the gap (not labeled) between the side walls 121.

The engagement portion 130 includes a cantilever 131 and an engagement structure 132. The cantilever 131 stands on the peripheral region 1110 of the top surface 111 and located in the other gap (not labeled) between the side walls 121. The engagement structure 132 is connected to the cantilever 131 so that the engagement portion 132 is connected to the top surface 111 via the cantilever portion 131. At least part of the engagement portion 132 is located in the accommodation space 140. The engagement structure 132 has a contact surface 1320 and an inclined guide surface 1321 that are respectively located at adjacent sides of the engagement portion 132. In more detail, the contact surface 1320 faces toward the top surface 111, and the inclined guide surface 1321 substantially faces away from the top surface 111.

The first electrically conductive component 200 is fixed to the base 100. In detail, in this embodiment, the first electrically conductive component 200 includes, for example, a first electrical contact part 201, a first support part 202, a first protruding part 203, two first fixed parts 204 and two holding structures 205.

The first support part 202 is connected to the first electrical contact part 201. The first protruding part 203 is located on the first support part 202. The first fixed parts 204 respectively protrude from two opposite sides of the first electrical contact part 201. The holding structures 205 protrudes from a side of the first electrical contact part 201 opposite to the first support part 202.

The first electrical contact part 201 is located in the accommodation space 140 and is configured to electrically contact the side surface 33 of the battery 30.

The first support part 202 is disposed through the recess 116 and protrudes from the top surface 111 and the bottom surface 112. As shown in FIG. 4, the first support part 202 extends outwards from the bottom surface 112 along a normal direction D1 of the bottom surface 112.

As shown in FIG. 4, the first protruding part 203 protrudes from the first support part 202 along a first protruding direction D2 that is perpendicular to the normal direction D1. In addition, the first protruding part 203 extends along a longitudinal direction D3 of the first support part 202, such that the first protruding part 203 has a certain amount of length to enhance the structural strength of the first support part 202.

Furthermore, in this embodiment, the first protruding part 203 does not contact the bottom surface 112, but the disclosure is not limited thereto; in other embodiments, a side of the first protruding part may contact the bottom surface of the bottom portion so that the bottom portion is clamped by the first protruding part and the first electrical contact part.

The first fixed parts 204 are respectively configured to be inserted into the insertion holes 113 so as to fix the first electrically conductive component 200 to the base 100 in position.

Figure 6:
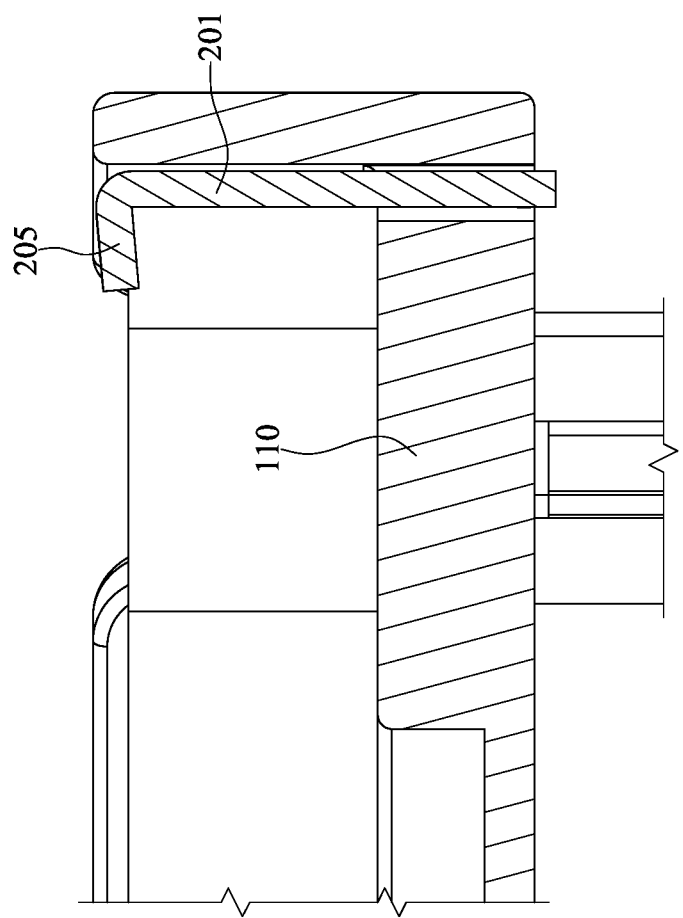
FIG. 6 is a partially enlarged cross-sectional side view of the battery holder in FIG. 3.

Further referring to FIG. 6, where FIG. 6 is a partially enlarged cross-sectional side view of the battery holder 10 in FIG. 3, the holding structure 205 is bent from an edge of the first electrical contact part 201 in an inclined downward direction towards the bottom portion 110. That is, the holding structure 205 is at an acute angle to the inner surface of the first electrical contact part 201. In addition, referring back to FIG. 3, the holding structures 205 are respectively on two reference lines L that pass through a central axis C of the accommodation space 140, and an angle θ formed by the two reference lines L is approximately less than or equal to 120 degrees.

The second electrically conductive component 300 is fixed to the base 100. In detail, in this embodiment, the second electrically conductive component 300 includes, for example, a second electrical contact part 301, a second support part 302, a second protruding part 303 and a second fixed part 304.

The second support part 302 is connected to the second electrical contact part 301. The second protruding part 303 is located on the second support part 302. Two opposite sides of the second fixed part 304 are respectively connected to the second electrical contact part 301 and the second support part 302.

Figure 7:
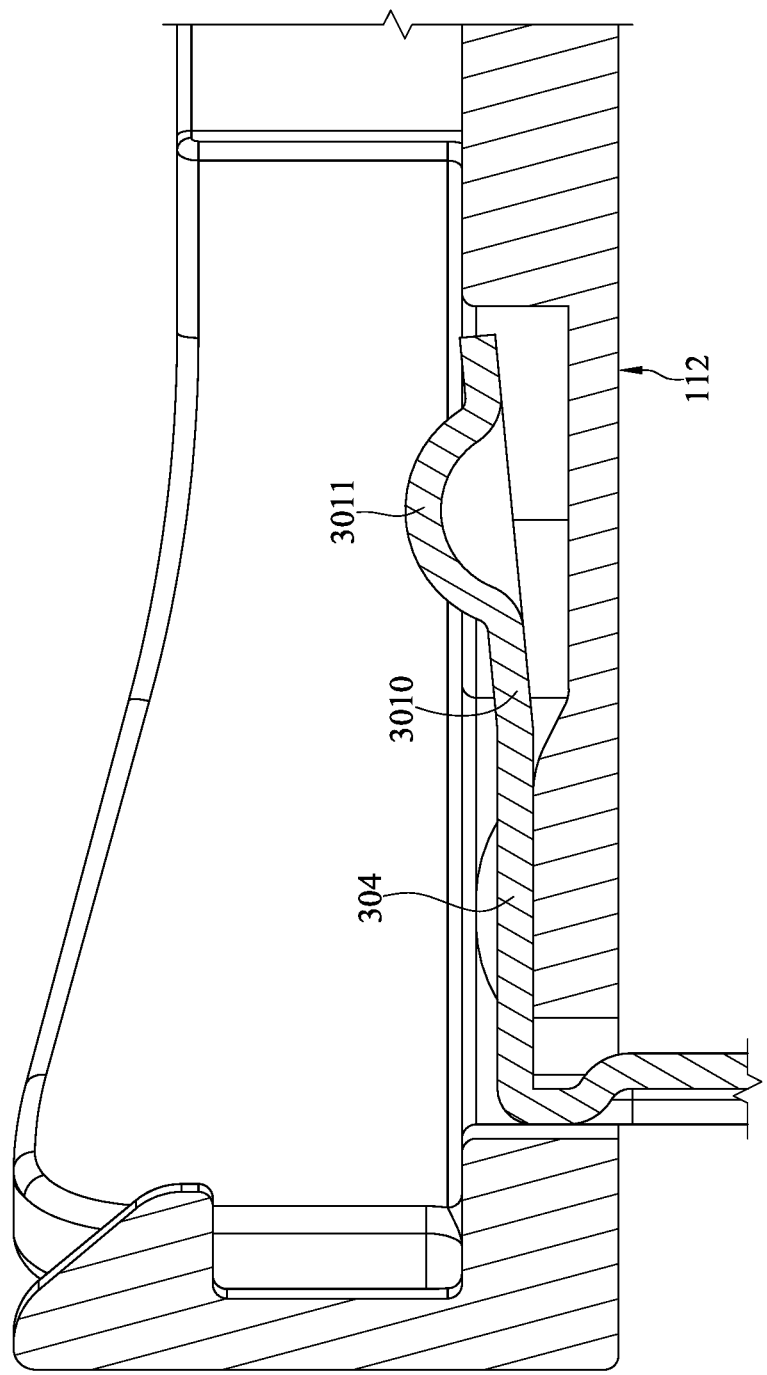
FIG. 7 is another partially enlarged cross-sectional side view of the battery holder in FIG. 3.

The second electrical contact part 301 is located in the accommodation space 140 and include, for example, a cantilever 3010 and a terminal 3011. The terminal 3011 protrudes from the cantilever 3010 so as to be located in the accommodation space 140, and is configured to electrically contact the bottom surface 32 of the battery 30. The cantilever 3010 is connected to the second fixed part 304 and is disposed in the installation recess 114. Please further refer to FIG. 7, where FIG. 7 is another partially enlarged cross-sectional side view of the battery holder in FIG. 3; the cantilever 3010 is bent from an edge of the second fixed part 304 in an inclined upward direction away from the bottom surface 112 of the bottom portion 110. That is, the cantilever 3010 is at an acute angle to the side surface of the second fixed part 304.

The second support part 302 is disposed through the through hole 117 and protrudes from the top surface 111 and the bottom surface 112. As shown in FIG. 4, the second support part 302 extends outwards from the bottom surface 112 along the normal direction D1 of the bottom surface 112.

As shown in FIG. 4, the second protruding part 303 protrudes from the second support part 302 along a second protruding direction D4 that is perpendicular to the normal direction D1. Also, the second protruding part 303 extends along a longitudinal direction D5 of the second support part 302, such that the second protruding part 303 has a certain amount of length to enhance the structural strength of the second support part 302. Furthermore, the first protruding direction D2 is, for example, opposite to the second protruding direction D4 so that the first protruding part 203 and the second protruding part 303 face toward each other.

The second fixed part 304 is configured to be installed in the installation recess 114, for example, by the fixing structure 115 via riveting so as to fix the second electrically conductive component 300 in position.

In addition, as shown in FIG. 2, a side of the first support part 202 that is located away from the first electrical contact part 201 is fixed to the plate 20, and a side of the second support part 302 that is located away from the second electrical contact part 301 is fixed to the plate 20, and the electronic component 22 is located between the bottom surface 112 of the bottom portion 110 of the battery holder 10 and the plate 20.

Please referring back to FIG. 1 to FIG. 3, during the installation of the battery 30, the bottom surface 32 of the battery 30 contacts and pushes the inclined guide surface 1321 of the engagement structure 132 of the engagement portion 130 so as to force the engagement portion 130 to slightly deform, and the deformed engagement portion 130 allows the battery 30 to be pushed into the accommodation space 140. When the battery 30 is in the accommodation space 140, the contact surface 1320 of the engagement structure 132 of the engagement portion 130 is able to hold the battery 30 in position by pressing against the top surface 31 of the battery 30. Meanwhile, the holding structures 205 are also in contact with the top surface 31 of the battery 30 so as to hold the battery 30 in position. As such, there are at least three different parts of the top surface 31 of the battery 30 are held in position. Additionally, as discussed above, the holding structures 205 are bent in an inclined downward direction towards the bottom portion 110, such that the holding structures 205 are able to firmly fix the battery 30 in the accommodation space 140. Moreover, as discussed above, the cantilever 3010 is in an inclined upward direction toward the accommodation space 140 or away from the bottom surface 112 of the bottom portion 110, such that the cantilever 3010 is able to apply force on the battery 30 so as to enhance the physical contact between the top surface 31 of the battery 30, the contact surface 1320 of the engagement structure 132, and the holding structure 205 of the first electrically conductive component 200. Thus, the cantilever 3010 is able to ensure the electrical connection between the terminal 3011 and the bottom surface 32 of the battery 30.

The engagement structure 132 can be moved away from the battery 30 when a certain amount of force is applied thereto to force the cantilever 131 to deform. As the engagement structure 132 is moved away from the top surface 31 of the battery 30, the battery 30 is not held by the contact surface 1320 of the engagement structure 132 but is still held by the holding structure 205 so that the force applied by the cantilever 3010 can move the battery 30 to an inclined state. The inclined state of the battery 30 makes the battery 30 more easier to be taken out from the accommodation space 140.

However, the engagement portion 130 and the holding structures 205 are optional; in other embodiments, the base may not include the engagement portion and the first electrically conductive component may not include the holding structures; in such a case, there may be an extra cover for covering and holding the battery in the accommodation space, alternatively, the battery may be fixed in position simply by tight contacting with the side portion of the base.

According to the circuit board discussed above, the first support part and the second support part both extend outwards along the normal direction of the bottom surface of the bottom portion, and the first protruding part and the second protruding part respectively extend along longitudinal directions of the first support part of the first electrically conductive component and the second support part of the second electrically conductive component, such that the first support part of the first electrically conductive component and the second support part of the second electrically conductive component have high structural strength for firmly keeping the base above the plate. As such, the height of the space between the bottom surface of the bottom portion and the plate of the circuit board is ensured so as to allow one or more electronic components to be disposed therein, which helps to increase the space utilization efficiency of the plate.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A circuit board, comprising:
   an electronic component, the electronic component disposed on the circuit board; and
   a battery holder, fixed to the circuit board, the battery holder comprising:
      a base, comprising a bottom portion and a side portion, wherein the bottom portion has a top surface and a bottom surface facing away from each other, the side portion stands on the top surface of the bottom portion, the side portion and the bottom portion form an accommodation space therebetween, and the top surface of the bottom portion is located in the accommodation space;
      a first electrically conductive component, fixed to the base and comprising a first electrical contact part, a first support part and a first protruding part, wherein the first support part is connected to the first electrical contact part, the first protruding part is located on the first support part, the first electrical contact part is located in the accommodation space, the first support part is disposed through the top surface of the bottom portion and the bottom surface of the bottom portion and extends outwards along a normal direction of the bottom surface of the bottom portion, the first protruding part extends along a longitudinal direction of the first support part, and a side of the first support part that is located away from the first electrical contact part is fixed to the circuit board; and a second electrically conductive component, fixed to the base and comprising a second electrical contact part, a second support part and a second protruding part, wherein the second support part is connected to the second electrical contact part, the second protruding part is located on the second support part, the second electrical contact part is located in the accommodation space, the second support part is disposed through the top surface of the bottom portion and the bottom surface of the bottom portion and extends outwards along the normal direction of the bottom surface of the bottom portion, the second protruding part extends along a longitudinal direction of the second support part, and a side of the second support part that is located away from the second electrical contact part is fixed to the circuit board;

wherein, the electronic component is located between the bottom surface of the bottom portion of the battery holder and the circuit board.

2. The circuit board according to claim 1, wherein the first electrically conductive component further comprises two first fixed parts, the bottom portion has two insertion holes, and the two first fixed parts respectively protrude from two opposite sides of the first electrical contact part, and are respectively configured to be inserted into the two insertion holes.

3. The circuit board according to claim 1, wherein the second electrically conductive component further comprises a second fixed part, two opposite sides of the second fixed part are respectively connected to the second electrical contact part and the second support part, and the second fixed part is fixed to the bottom portion.

4. The circuit board according to claim 1, wherein the side portion comprises two side walls, the two side walls stand on a peripheral region of the top surface of the bottom portion and are spaced apart from each other, the base further comprises an engagement portion, the engagement portion comprises a cantilever and an engagement structure, the cantilever stand on the peripheral region of the top surface of the bottom portion, and is located between the two side walls, the engagement structure is connected to the cantilever and is located in the accommodation space, the engagement structure has a contact surface and an inclined guide surface that are adjacent to each other, and the contact surface faces toward the top surface of the bottom portion.

5. The circuit board according to claim 1, wherein the first electrically conductive component further comprises two holding structures that protrude from a side of the first electrical contact part that is opposite to the first support part.

6. The circuit board according to claim 5, wherein in each of the two holding structures, the holding structure is bent from an edge of the first electrical contact part in an inclined downward direction towards the bottom portion.

7. The circuit board according to claim 5, wherein the two holding structures are respectively on two reference lines that pass through a central axis of the accommodation space, and an angle formed by the two reference lines is less than or equal to 120 degrees.

8. The circuit board according to claim 3, wherein the second electrical contact part comprises a cantilever and a terminal, the terminal protrudes from the cantilever so as to be located in the accommodation space, the cantilever is connected to the second fixed part, and the cantilever is bent from an edge of the second fixed part in an inclined upward direction away from the bottom surface of the bottom portion.

9. The circuit board according to claim 1, wherein the bottom portion further has an installation recess, the installation recess is formed on the top surface of the bottom portion, and the second electrical contact part of the second electrically conductive component and the second fixed part are configured to be installed in the installation recess.

10. A battery holder, configured to be fixed to a circuit board, the battery holder comprising:

a base, comprising a bottom portion and a side portion, wherein the bottom portion has a top surface and a bottom surface facing away from each other, the side portion stands on the top surface of the bottom portion so that the side portion and the bottom portion form an accommodation space therebetween, and the top surface of the bottom portion is located in the accommodation space;

a first electrically conductive component, fixed to the base and comprising a first electrical contact part, a first support part and a first protruding part, wherein the first support part is connected to the first electrical contact part, the first protruding part is located on the first support part, the first electrical contact part is located in the accommodation space, the first support part is disposed through the top surface of the bottom portion and the bottom surface of the bottom portion and extends outwards along a normal direction of the bottom surface of the bottom portion, the first protruding part extends along a longitudinal direction of the first support part, and a side of the first support part that is located away from the first electrical contact part is fixed to the circuit board; and a second electrically conductive component, fixed to the base and comprising a second electrical contact part, a second support part and a second protruding part, wherein the second support part is connected to the second electrical contact part, the second protruding part is located on the second support part, the second electrical contact part is located in the accommodation space, the second support part is disposed through the top surface of the bottom portion and the bottom surface of the bottom portion and extends outwards along the normal direction of the bottom surface of the bottom portion, the second protruding part extends along a longitudinal direction of the second support part, and a side of the second support part that is located away from the second electrical contact part is fixed to the circuit board.

* * * * *